(12) United States Patent
Kakui

(10) Patent No.: US 9,001,416 B2
(45) Date of Patent: Apr. 7, 2015

(54) PULSED LIGHT SOURCE

(75) Inventor: Motoki Kakui, Yokohama (JP)

(73) Assignee: Megaopto Co., Ltd., Wako-shi (JP)

( * ) Notice: Subject to any disclaimer, the term of this patent is extended or adjusted under 35 U.S.C. 154(b) by 61 days.

(21) Appl. No.: 13/477,829

(22) Filed: May 22, 2012

(65) Prior Publication Data

US 2012/0300290 A1 Nov. 29, 2012

Related U.S. Application Data

(60) Provisional application No. 61/503,168, filed on Jun. 30, 2011.

(30) Foreign Application Priority Data

May 24, 2011 (JP) .............. P2011-115982

(51) Int. Cl.
| | | |
|---|---|---|
| H01S 3/10 | (2006.01) | |
| H01S 3/23 | (2006.01) | |
| H01S 3/067 | (2006.01) | |
| H01S 3/00 | (2006.01) | |
| B23K 26/06 | (2014.01) | |

(Continued)

(52) U.S. Cl.
CPC ........... *H01S 3/2308* (2013.01); *H01S 3/06733* (2013.01); *H01S 3/005* (2013.01); *B23K 26/063* (2013.01); *H01S 3/1618* (2013.01); *H01S 3/0057* (2013.01); *H01S 3/06758* (2013.01); *H01S 3/1693* (2013.01); *H01S 3/10015* (2013.01); *H01S 3/0064* (2013.01); *H01S 3/176* (2013.01); *B23K 26/0608* (2013.01); *H01S 3/0078* (2013.01); *H01S 3/094003* (2013.01)

(58) Field of Classification Search
USPC ................... 359/337.2, 337.4; 372/6
See application file for complete search history.

(56) References Cited

U.S. PATENT DOCUMENTS 4,764,731 A * 8/1988 Salour ............................ 359/337
4,764,739 A * 8/1988 Salour ............................ 359/337

(Continued)

FOREIGN PATENT DOCUMENTS

| JP | 11-195829 A | 7/1999 |
| JP | 2000-258809 A | 9/2000 |

(Continued)

OTHER PUBLICATIONS

International Preliminary Report on Patentability and Written Opinion in PCT International Application No. PCT/JP2012/062655, dated Dec. 5, 2013.

*Primary Examiner* — Ari M Diacou
(74) *Attorney, Agent, or Firm* — Venable LLP; Michael A. Sartori; George L. Howarah

(57) ABSTRACT

The invention relates to a pulsed light source capable of effectively utilizing optical power and selecting the pulse width of output pulsed light. A pulsed light source has a MOPA structure, and comprises a seed light source and an optical fiber amplifier. The seed light source includes a semiconductor laser outputting pulsed light. In the optical fiber amplifier, an optical filter branches pulsed light amplified by a YbDF into a first wavelength component including the peak wavelength and the remaining second wavelength component. An optical switch outputs one of the pulsed light of the first wavelength component and the pulsed light of the second wavelength component which are inputted. Another YbDF amplifies the pulsed light outputted from the optical switch.

9 Claims, 7 Drawing Sheets

(51) Int. Cl.
*H01S 3/16* (2006.01)
*H01S 3/17* (2006.01)
*H01S 3/094* (2006.01)

(56) References Cited

U.S. PATENT DOCUMENTS

| | | | |
|---|---|---|---|
| 5,187,760 A * | 2/1993 | Huber | 385/37 |
| 5,340,979 A * | 8/1994 | Baney et al. | 250/214 B |
| 5,521,751 A * | 5/1996 | Aida et al. | 359/337 |
| 5,561,551 A * | 10/1996 | Iwasaki et al. | 359/337 |
| 5,696,707 A * | 12/1997 | Hentschel et al. | 702/69 |
| 5,781,322 A * | 7/1998 | Uchiyama et al. | 398/38 |
| 5,812,253 A * | 9/1998 | Nishikawa | 356/73.1 |
| 5,978,131 A * | 11/1999 | Lauzon et al. | 359/337.5 |
| 6,061,369 A * | 5/2000 | Conradi | 372/6 |
| 6,069,731 A * | 5/2000 | Bayart | 359/341.41 |
| 6,292,289 B1 * | 9/2001 | Sugaya et al. | 359/337 |
| 6,437,907 B1 * | 8/2002 | Yoon et al. | 359/341.32 |
| 6,751,011 B2 * | 6/2004 | Sakurai | 359/333 |
| 7,016,106 B2 * | 3/2006 | Song et al. | 359/341.1 |
| 7,034,997 B2 * | 4/2006 | Hwang et al. | 359/349 |
| 7,224,519 B2 * | 5/2007 | Shin et al. | 359/344 |
| 7,271,949 B2 * | 9/2007 | Kim et al. | 359/337.21 |
| 7,324,208 B2 * | 1/2008 | Niki | 356/484 |
| 7,508,577 B2 * | 3/2009 | Benz et al. | 359/337.2 |
| 7,580,183 B2 * | 8/2009 | Kakui et al. | 359/334 |
| 7,605,974 B1 * | 10/2009 | Ionov | 359/344 |
| 7,626,759 B2 * | 12/2009 | Betin et al. | 359/346 |
| 7,646,532 B2 * | 1/2010 | Capouilliet et al. | 359/334 |
| 8,077,385 B2 * | 12/2011 | Yang et al. | 359/349 |
| 8,259,388 B2 * | 9/2012 | Miyauchi | 359/337 |
| 8,290,004 B2 * | 10/2012 | Kakui | 372/6 |
| 8,346,098 B2 * | 1/2013 | Feng | 398/202 |
| 8,363,312 B1 * | 1/2013 | Honea et al. | 359/341.41 |
| 8,379,301 B2 * | 2/2013 | Wang | 359/344 |
| 8,422,121 B2 * | 4/2013 | Itoh et al. | 359/337.13 |
| 8,488,233 B2 * | 7/2013 | Huang et al. | 359/337.21 |
| 2001/0050807 A1 * | 12/2001 | Deguchi et al. | 359/341.44 |
| 2003/0108071 A1 * | 6/2003 | Hedin et al. | 372/32 |
| 2004/0233516 A1 * | 11/2004 | Hwang et al. | 359/349 |
| 2004/0233518 A1 * | 11/2004 | Song et al. | 359/349 |
| 2005/0185259 A1 * | 8/2005 | Kim et al. | 359/341.1 |
| 2005/0225840 A1 * | 10/2005 | Drasek et al. | 359/333 |
| 2006/0204169 A1 * | 9/2006 | Li | 385/16 |
| 2006/0221436 A1 * | 10/2006 | Benz et al. | 359/337.2 |
| 2008/0130101 A1 * | 6/2008 | Kakui | 359/341.3 |
| 2009/0022189 A1 * | 1/2009 | Okuno | 372/25 |
| 2009/0046352 A1 * | 2/2009 | Brunet et al. | 359/333 |
| 2009/0141751 A1 * | 6/2009 | Kakui | 372/25 |
| 2009/0174930 A1 * | 7/2009 | McCahon et al. | 359/334 |
| 2009/0274183 A1 * | 11/2009 | Kakui | 372/31 |
| 2010/0033548 A1 * | 2/2010 | Kaneuchi et al. | 347/225 |
| 2010/0091356 A1 * | 4/2010 | Huang et al. | 359/337.2 |
| 2010/0135340 A1 * | 6/2010 | Kitabayashi | 372/6 |
| 2010/0302626 A1 * | 12/2010 | Kakui | 359/334 |
| 2011/0292953 A1 * | 12/2011 | Liu et al. | 372/20 |
| 2012/0170938 A1 * | 7/2012 | Evans et al. | 398/91 |

FOREIGN PATENT DOCUMENTS

| | | |
|---|---|---|
| JP | 2008-205425 A | 9/2008 |
| JP | 2008-251945 A | 10/2008 |
| JP | 2009-152560 | 7/2009 |

* cited by examiner

PULSED LIGHT SOURCE

CROSS-REFERENCE TO RELATED APPLICATION

This application is based upon and claims the benefit of priorities from U.S. Provisional Application No. 61/503,168, filed on Jun. 30, 2011 and Japanese Patent Application No. 2011-115982, filed on May 24, 2011, the entire contents of which are incorporated herein by reference.

BACKGROUND OF THE INVENTION

1. Field of the Invention

The present invention relates to a pulsed light source.

2. Related Background Art

Pulsed light sources are used in industrial applications, of which laser machining and similar are representative. In general, in laser machining of minute machining objects, it is extremely important that the pulse width of the pulsed laser light be optimized according to various machining objects in order to improve machining quality. Japanese Patent Application Laid-open No. 2009-152560 (Patent Document 1) describes a MOPA structure pulsed light source in which pulsed light outputted from a directly-modulated semiconductor laser is amplified by an optical fiber amplifier. The pulsed light source described in the above-described Patent Document 1 compresses the pulse width of the output pulsed light by using a band-pass filter to remove only a portion of the spectral components among the pulsed light outputted from the seed light source.

SUMMARY OF THE INVENTION

The present inventor have examined the above conventional pulsed light sources, and as a result, have discovered the following problems. That is, pulsed light sources described in the above-described Patent Document 1 use a band-pass filter to remove only a portion of the spectral components of the pulsed light emitted from a seed light source. Hence, as compared with the average output power before transmission through the band-pass filter, the average output power after transmission through the band-pass filter is greatly reduced.

Further, in actual laser machining, there are cases in which, in the pulsed light sources described in the above-described Patent Document 1, more rather than less satisfactory machining quality is obtained by machining using the pulsed light with a broader pulse width (that is, pulsed light with a pulse width of several nanoseconds or greater) blocked by the band-pass filter.

The present invention has been developed to eliminate the problems described above. It is an object of the present invention to provide a pulsed light source in which effective utilization of optical power is made possible, and which moreover is provided with a structure to enable selection of the pulse width of the output pulsed light.

DESCRIPTION OF THE PREFERRED EMBODIMENTS

In the following, embodiments of the present invention are explained in detail, referring to the attached drawings. In explanations of the drawings, the same symbols are assigned to the same elements, and redundant explanations are omitted.

(First Embodiment)

Figure 1:
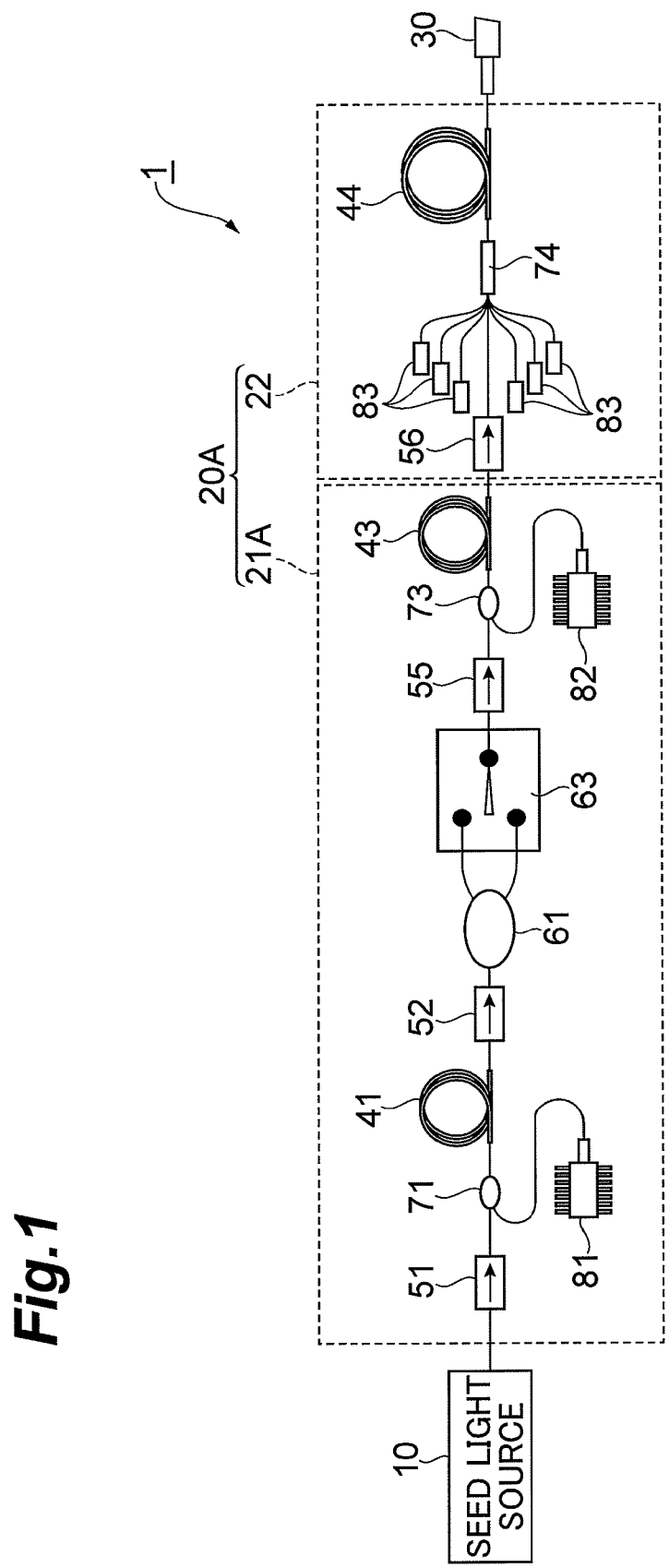
FIG. 1 is a view showing a configuration of a first embodiment of a pulsed light source according to the present invention.

FIG. 1 is a view showing a configuration of the pulsed light source 1 according to a first embodiment. In FIG. 1, the pulsed light source 1 has a MOPA (Master Oscillator Power Amplifier) structure, and comprises a seed light source 10 and an optical fiber amplifier 20A. The seed light source 10 is a light source which can be directly modulated at driving currents in the range 0 to 220 mA, and includes a 1060 nm-band Fabry-Perot semiconductor laser which outputs pulsed light.

The optical fiber amplifier 20A includes a pre-amplifier 21A and a booster amplifier 22. The pre-amplifier 21A includes a YbDF 41, an optical filter 61, an optical switch 63, and a YbDF 43 and the like. The booster amplifier 22 includes a YbDF 44 and the like. Each of the pre-amplifier 21A and the booster amplifier 22 is an optical fiber amplifier which amplifies the pulsed light repeatedly outputted from the seed light source 10 and outputs the amplified pulsed light through the end cap 30. The pulsed light source 1 outputs pulsed light with wavelength near 1060 nm which is preferable for laser machining.

Each of the YbDFs 41, 43 and 44 is a light amplification media which amplifies the pulsed light having a wavelengths near 1060 nm and outputted from the seed light source 10, and in which a core of an optical fiber composed of silica glass is doped with Yb element as an activating material. Each of the YbDFs 41, 43 and 44 is advantageous with respect to power conversion efficiency because a pumping light wavelength and amplified light wavelength near each other, and is also advantageous in having a high gain at wavelengths near 1060 nm. These YbDFs 41, 43 and 44 form a three-stage optical fiber amplifier.

The first-stage YbDF 41 is supplied with pumping light in the forward direction from the pumping light source 81, through the optical coupler 71. The YbDF 41 inputs the pulsed light from the seed light source 10 through the optical isolator 51 and optical coupler 71. The YbDF 41 amplifies the input pulsed light, and outputs the amplified pulsed light through the optical isolator 52.

The optical filter 61 inputs the input the pulsed light from the first-stage YbDF 41 (pulsed light amplified by the first-stage YbDF 41) through the optical isolator 52. The optical filter 61 branches the input pulsed light into a first wavelength component, including the peak wavelength and the remaining second wavelength component, and outputs both the branched wavelength components. The optical switch 63 inputs both the pulsed light of the first wavelength component and the pulsed light of the second wavelength component, which are outputted from the optical filter 61. The optical switch 63 selects both of the pulsed light of the input first and second wavelength component, and outputs the pulsed light of the selected wavelength component to the optical isolator 55.

The second-stage YbDF 43 is supplied with pumping light in the forward direction from the pumping light source 82, through the optical coupler 7. The YbDF 43 inputs the pulsed light from the optical switch 63 (pulsed light selected by and outputted from the optical switch 63) through the optical isolator 55. The YbDF 43 amplifies such an input pulsed light and outputs the amplified pulsed light.

The third-stage YbDF 44 is supplied with pumping light in the forward direction from six pumping light sources 83, through an optical combiner 74. The YbDF 44 inputs the input pulsed light from the second-stage YbDF 43 (pulsed light amplified by the second-stage YbDF 43) through an optical isolator 56 and the optical combiner 74. The YbDF 44 further amplifies the input pulsed light and outputs the amplified pulsed light, through the end cap 30, to outside the pulsed light source 1.

A more preferred configuration example is as follows. Each of the YbDFs 41 and 43 is Al co-doped silica-based YbDFs with a single-cladding structure, with an Al concentration of 5 wt %, a core diameter of 7 μm, a cladding diameter of 125 μm, unsaturated absorption of pumping light in the 915 nm band of 70 dB/m, an unsaturated absorption peak for pumping light in the 975 nm band of 240 dB/m, and a length of 7 m. The third-stage YbDF 44 is an Al co-doped silica-based YbDF with a dual-cladding structure, with an Al concentration of 1 wt %, a core diameter of 10 μm, a cladding diameter of 125 μm, unsaturated absorption of pumping light in the 915 nm band of 1.5 dB/m, and a length of 3.5 m.

The wavelengths of pumping light supplied to the YbDFs 41, 43 and 44 are all in the 0.98 μm band. The pumping light supplied to the first-stage YbDF 41 has power of 200 mW, and is single-mode light. The pumping light supplied to the second-stage YbDF 43 has power of 200 mW, and is single-mode light. The pumping light supplied to the third-stage YbDF 44 has power of 24 W, and is multi-mode light.

Among the first wavelength component and the second wavelength component which are outputted from the optical filter 61, the second wavelength component does not include the peak wavelength of the spectrum of the seed light outputted from the seed light source 10. Hence the second wavelength component is a wavelength component from which only the chirping component of the light outputted from the seed light source 10 has been removed. By thereafter amplifying the pulsed light of the second wavelength component, pulsed light with a short pulse width can be generated.

Figure 2B:
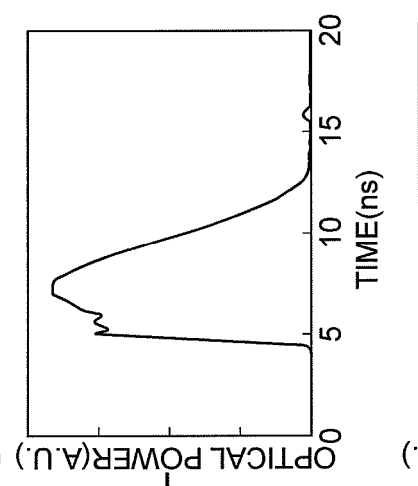
FIGS. 2A to 2C are views showing one configuration example of an optical filter included in the pulsed light source of FIG. 1.
Figure 2C:
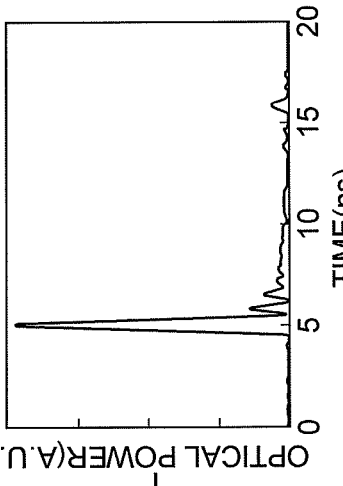
Figure 2A:
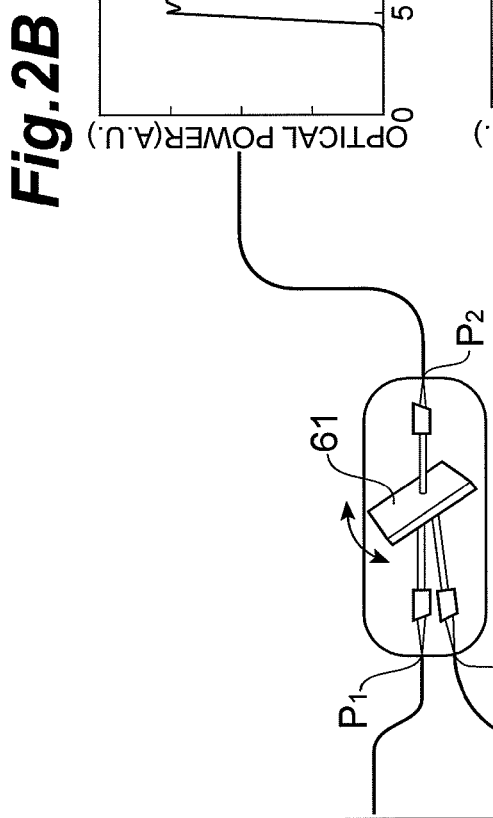
Figure 2A:
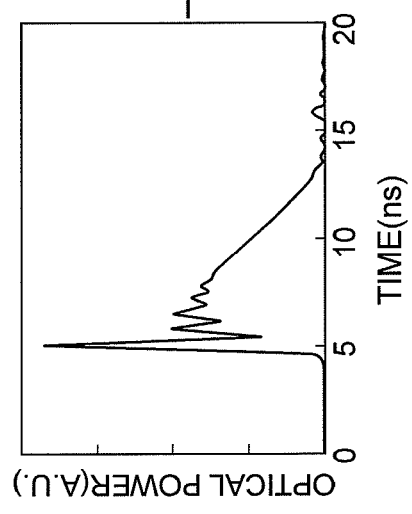

FIGS. 2A to 2C are views showing one configuration example of the optical filter 61 included in the pulsed light source 1 according to the first embodiment. As shown in FIGS. 2A to 2C, the optical filter 61 may also be a WDM filter configured from a dielectric multilayer film filter. The optical filter 61 takes pulsed light input to the port $P_1$. Among the input pulsed light, the optical filter 61 outputs from the port $P_3$ the first wavelength component on the short-wavelength side, including the peak wavelength, and outputs from the port $P_2$ the remaining second wavelength component. FIG. 2A shows the pulse waveform of the pulsed light inputted to the port $P_1$. FIG. 2B shows the pulse waveform of the pulsed light of the second wavelength component outputted from the port $P_2$. And, FIG. 2C shows the pulse waveform of the pulsed light of the first wavelength component outputted from the port $P_3$.

Figure 3:
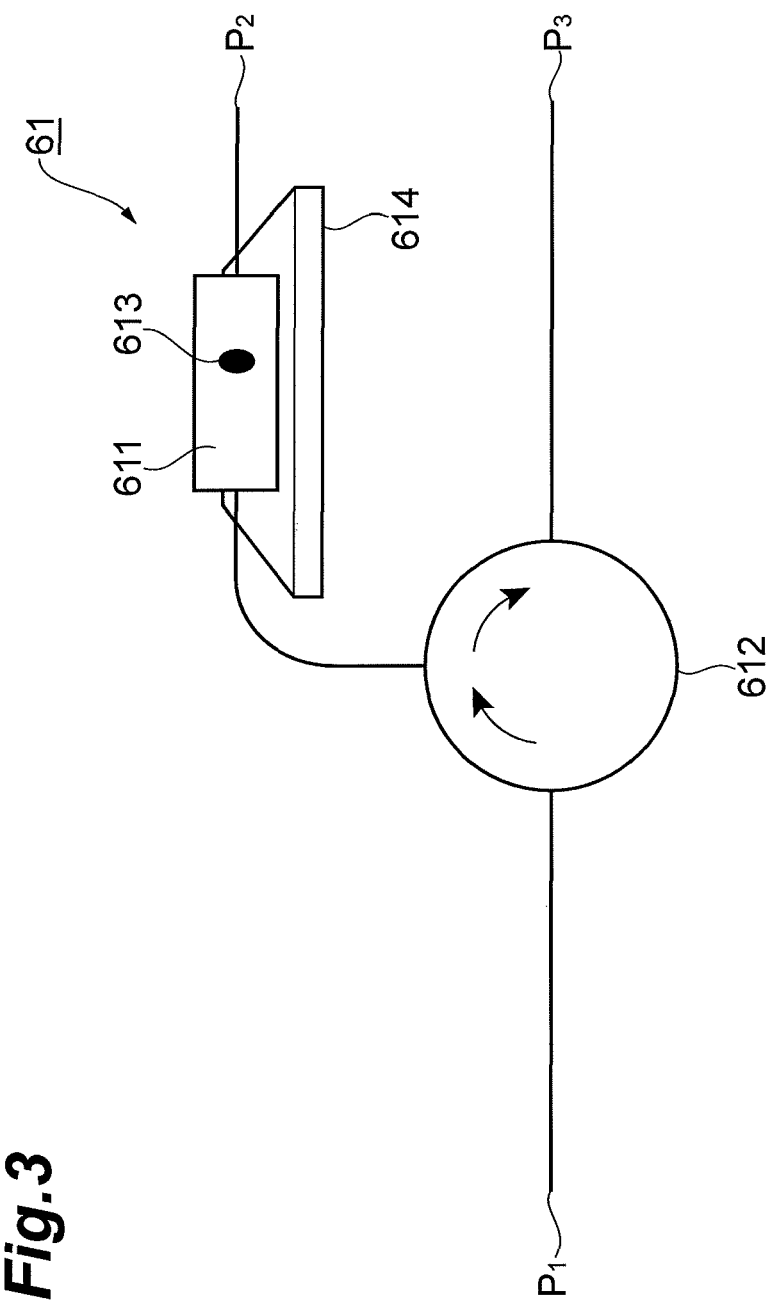
FIG. 3 is a view showing another configuration example of an optical filter included in the pulsed light source of FIG. 1.

FIG. 3 is a view showing another configuration example of the optical filter 61 included in the pulsed light source 1 according to the first embodiment. As shown in FIG. 3, the optical filter 61 may be configured from a fiber Bragg grating 611 and an optical circulator 612. The fiber Bragg grating 611 transmits pulsed light of the first wavelength component, and reflects pulsed light of the second wavelength component. The optical filter 61 inputs the pulsed light to the port $P_1$. Among the input pulsed light, the optical filter 61 outputs from the port $P_2$ the first wavelength component, including the peak wavelength, and outputs from the port $P_3$ the remaining second wavelength component.

An optical filter configured from a dielectric multilayer film filter is inexpensive, but has the risk of high optical damage. On the other hand, an optical filter configured from a fiber Bragg grating has a sharp change in transmissivity near the cutoff wavelength, and can be expected to satisfactorily separate sub-nanosecond pulses and nanosecond-order pulses. Or, an optical circulator with a plurality of ports and a FBG with a plurality of wavelengths may be used to realize not two outputs, but three or more outputs.

Further, as shown in FIG. 3, in the case of an optical filter 61 configured from a fiber Bragg grating 611, by for example adjusting the temperature of the fiber Bragg grating 611 using a thermistor 613 and a Peltier element 614, the center reflection wavelength of the fiber Bragg grating 611 may be adjusted. Or, by applying mechanical tension to the fiber Bragg grating 611, the center reflection wavelength of the fiber Bragg grating 611 may be adjusted.

Figure 4A:
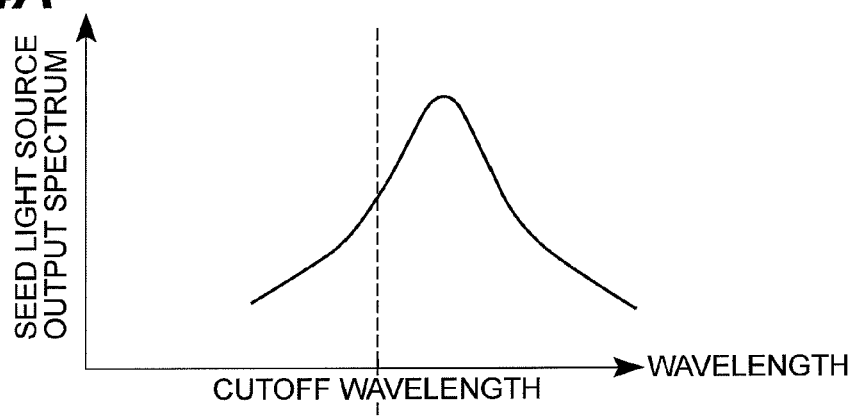
FIGS. 4A and 4B are views for explaining branching characteristics of the optical filter included in the pulsed light source of FIG. 1.
Figure 4B:
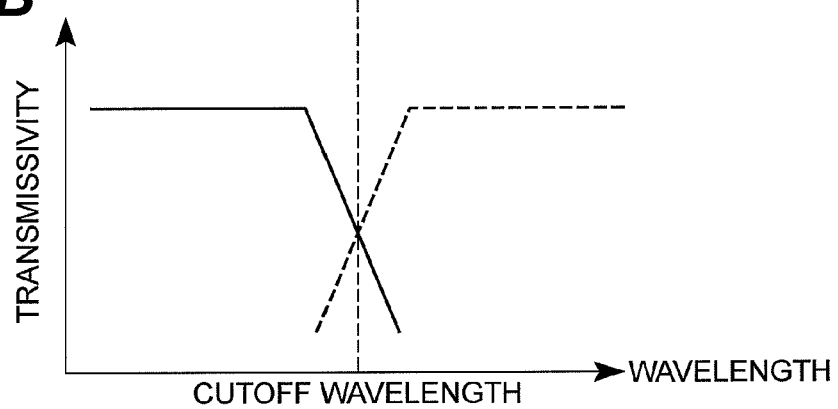
Figure 5A:
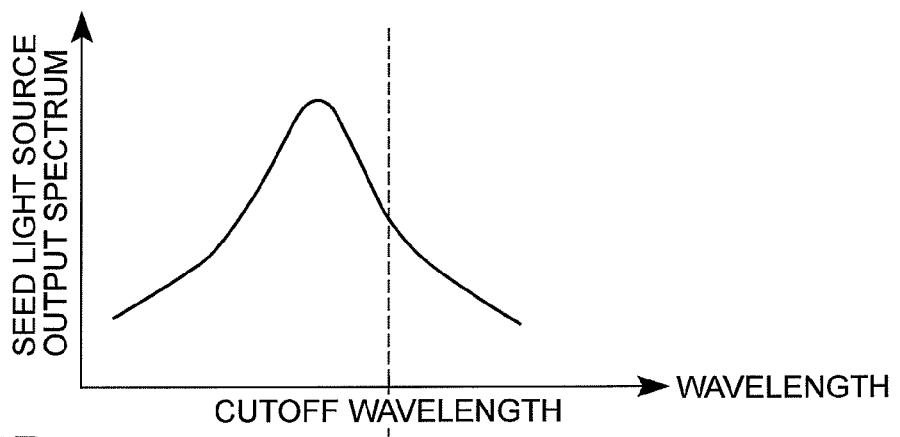
FIGS. 5A and 5B are views for explaining branching characteristics of the optical filter included in the pulsed light source of FIG. 1.
Figure 5B:
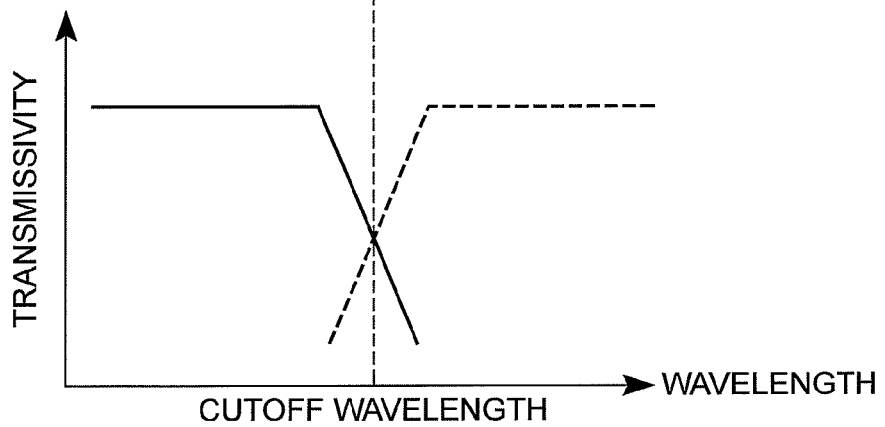

FIGS. 4A to 4B and 5A to 5B are views for explaining the branching characteristics of the optical filter 61 included in the pulsed light source 1 of the first embodiment. FIGS. 4A and 5A show the spectra of output pulsed light of the seed source 10, while FIGS. 4B and 5B show the branching characteristics of the optical filter 61. In FIGS. 4B and 5B, among the transmittances from the port $P_1$ to the ports $P_2$ and $P_3$, one is shown as a solid line and the other as a dashed line.

As shown in these figures, in the optical filter 61 it is necessary to select appropriately, in accordance with the characteristics of the seed light source 10, whether to remove the long-wavelength side including the peak wavelength of the output spectrum of the seed light source 10, or whether to remove the short-wavelength side including the peak wavelength. Hence the cutoff wavelength of the optical filter 61 must be decided in accordance with the output spectrum of the seed light source 10, and angular fine adjustment may be necessary together with design during manufacturing. Further, combined use of temperature adjustment of the seed light source 10 is also effective.

It is preferable that the pulse full widths at half-maximum of the pulsed light of the first wavelength component and the pulse full widths at half-maximum of the pulsed light of the second wavelength component outputted from the optical filter 61 be different by a factor of ten or more (one order of magnitude or more). It is preferable that, among the pulsed light of the first wavelength component and the pulsed light of the second wavelength component, one by a sub-nanosecond pulse, and the other be a nanosecond-order pulse.

The optical filter 61 may be inserted directly after the seed light source 10, but in order to prevent degradation of the optical SN ratio, it is more desirable that the optical filter 61 be inserted into the optical path within the optical amplifier unit, as shown in FIG. 1. However, in this case it is desirable that the optical filter 61 be inserted into the optical path within the pre-amplifier 21A with comparatively low light output, so that breakdown of the optical filter 61 does not occur.

The optical switch 63 provided in the stage after the optical filter 61 inputs both the pulsed light of the first wavelength component and the pulsed light of the second wavelength component, outputted from the optical filter 61. The optical switch 63 selects and outputs one among these. As the optical switch 63, a mechanical type, electro-optical type, or other 2×1 optical switch is used. When switching the optical switch 63, it is desirable that prior to switching the pumping powers of the YbDFs 43 and 44 which are downstream from the optical switch 63 be lowered sufficiently, and that after completion of switching the pumping powers of the YbDFs 43 and 44 be raised. By this means, the occurrence of optical damage in the optical switch 63 during the switching transition interval can be avoided.

The pulsed light source 1 according to the present embodiment selects one among the pulsed light of the first wavelength component and the pulsed light of the second wavelength component, and amplifies the selected wavelength component pulsed light. Hence the pulsed light source 1 can select and output pulsed light with a broad pulse width and pulsed light with a narrow pulse width. As a result, in the first embodiment, effective utilization of optical power is possible, and the pulse width of the output pulsed light can be selected.

(Second Embodiment)

Figure 6:
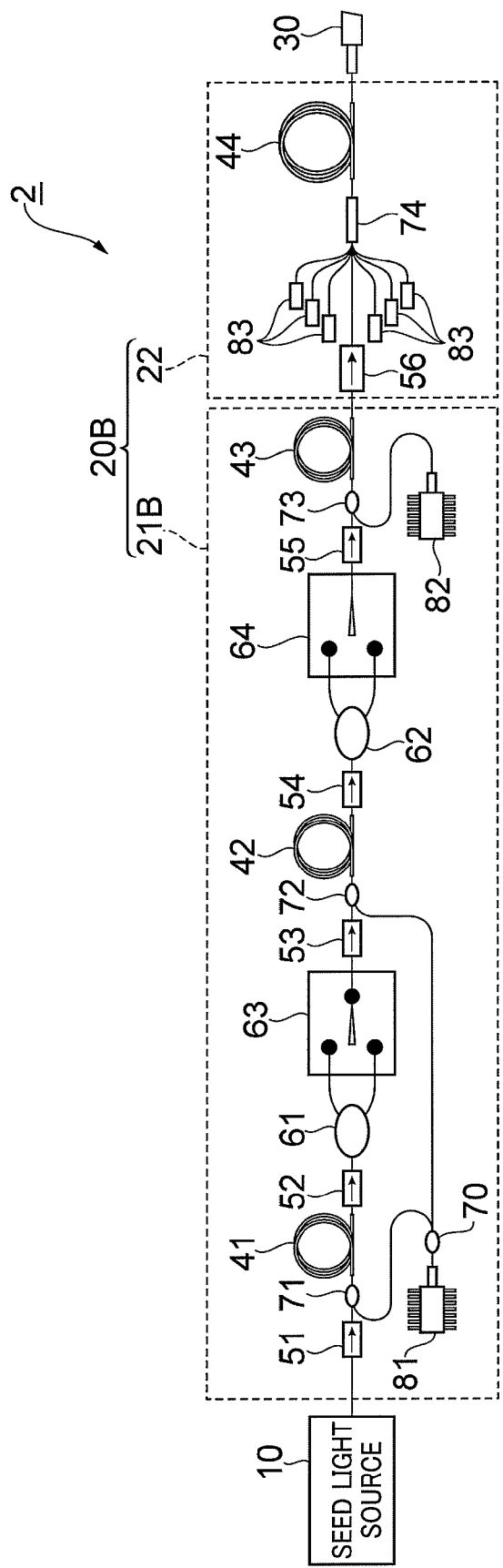
FIG. 6 is a view showing a configuration of a second embodiment of a pulsed light source according to the present invention.

FIG. 6 is a view showing a configuration of the pulsed light source 2 according to a second embodiment. The pulsed light source 2 has a MOPA structure, and comprises a seed light source 10 and an optical fiber amplifier 20B. As compared with the configuration of the pulsed light source 1 according to the first embodiment shown in FIG. 1, the pulsed light source 2 according to the second embodiment shown in FIG. 6 differs in comprising an optical fiber amplifier 20B including a pre-amplifier 21B in place of the optical fiber amplifier 20A including the pre-amplifier 21A.

As compared with the configuration of the pre-amplifier 21A shown in FIG. 1, the pre-amplifier 21B shown in FIG. 6 differs in further comprising a YbDF 42, optical isolator 53, optical isolator 54, optical filter 62, optical switch 64, optical coupler 70, and optical coupler 72.

The YbDF 42, similarly to the YbDFs 41, 43 and 44, is an optical amplification medium which amplifies the pulsed light having a wavelength near 1060 nm and outputted from the seed light source 10, and in which a core of an optical fiber composed of silica glass is doped with Yb element as an activating material. These YbDFs 41, 42, 43 and 44 form a four-stage optical fiber amplifier.

The YbDF 42 is supplied with pumping light in the forward direction from the pumping light source 81 through the optical coupler 70 and optical coupler 72. The YbDF 42 inputs the pulsed light from the optical switch 63 (pulsed light selected and outputted by the optical switch 63) through the optical isolator 53 and optical coupler 72. The YbDF 42 amplifies the input pulsed light and outputs amplified pulsed light.

The optical filter 62 inputs the pulsed light from the YbDF 42 (pulsed light amplified by the YbDF 42) through the optical isolator 54. The optical filter 62 branches the input pulsed light into a first wavelength component including the peak wavelength and the remaining second wavelength component, and outputs both branched wavelength components. The optical switch 64 inputs both the pulsed light of the first wavelength component and the pulsed light of the second wavelength component, which are outputted from the optical filter 62, and selects one among these. The pulsed light of the selected wavelength components is outputted to the optical isolator 55.

The YbDF 42 as a structure similar to that of the YbDFs 41 and 43. The optical filter 62 has a structure similar to that of the optical filter 61. The optical switch 64 has a structure similar to that of the optical switch 63. In the second embodiment, in addition to the set of the optical filter 61 and optical switch 63, the set of the optical filter 62 and optical switch 64 is further provided. When the optical filter wavelength discrimination characteristic is insufficient, it is desirable that such an optical filter with two or more stages be used.

(Third Embodiment)

Figure 7:
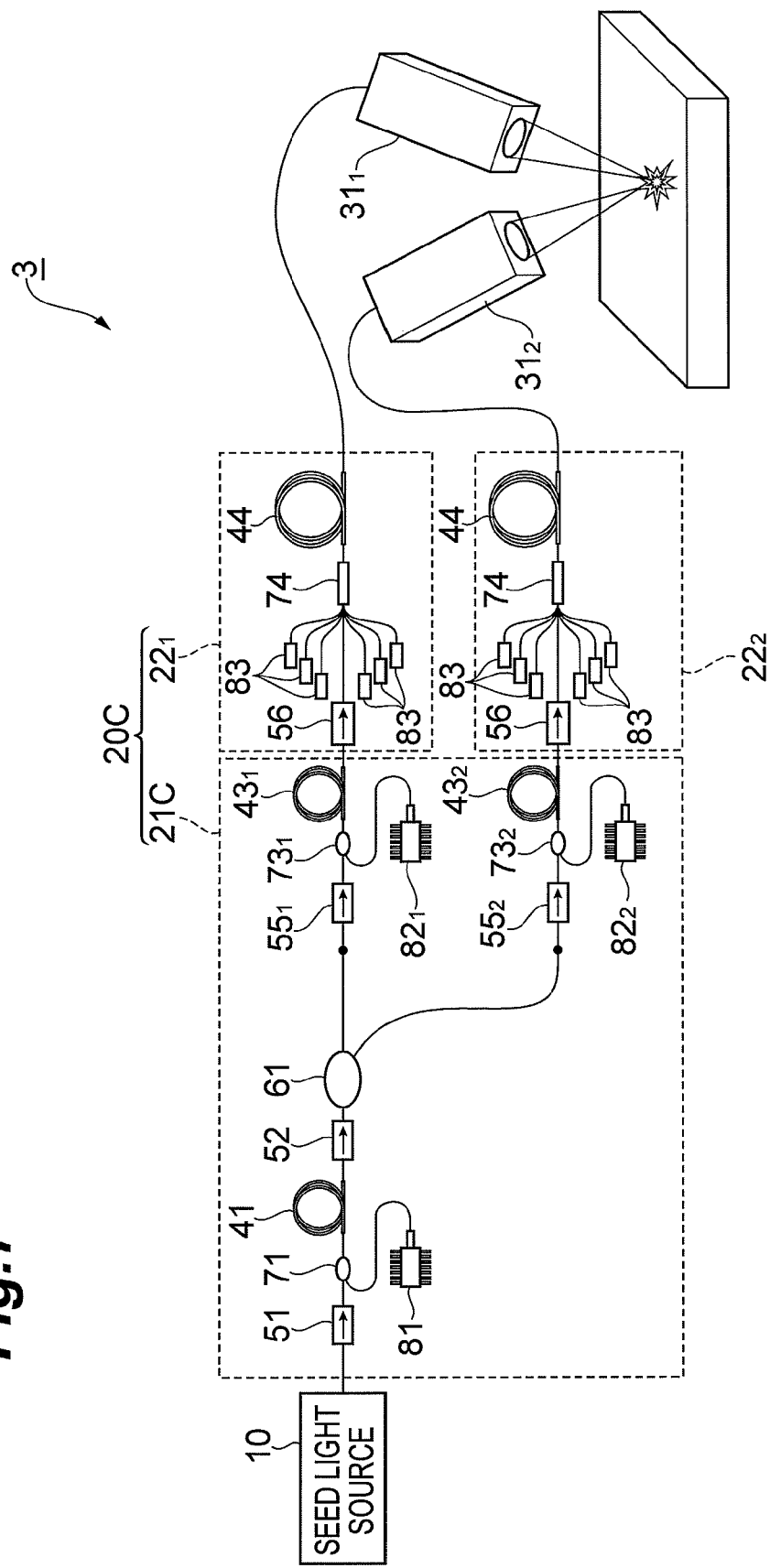
FIG. 7 is a view showing a configuration of a third embodiment of a pulsed light source according to the present invention.

FIG. 7 is view showing the configuration of the pulsed light source 3 according to a third embodiment. In FIG. 7, the pulsed light source 3 has a MOPA structure, and comprises a seed light source 10 and an optical fiber amplifier 20C. As compared with the configuration of the pulsed light source 1 according to the first embodiment shown in FIG. 1, the pulsed light source 3 according to the third embodiment shown in FIG. 7 differs in comprising an optical fiber amplifier 20C in place of the optical fiber amplifier 20A. The optical fiber amplifier 20C includes a pre-amplifier 21C and booster amplifiers $22_1$ and $22_2$.

As compared with the configuration of the pre-amplifier 21A in the first embodiment, the pre-amplifier 21C in the present embodiment differs in that an optical switch 63 is not provided. Further, the pre-amplifier 21C in the present embodiment includes, as the amplifying unit in the stage after the optical switch 61, a YbDF $43_1$ as a first amplifying unit which amplifies pulsed light of the first wavelength component outputted from the optical switch 61, an optical isolator $55_1$, an optical coupler $73_1$, and a pumping light source $82_1$. Further, the pre-amplifier 21C in this embodiment includes a YbDF $43_2$ as a second amplifying unit which amplifies pulsed light of the second wavelength component outputted from the optical switch 61, an optical isolator $55_2$, an optical coupler $73_2$, and a pumping light source $82_2$.

The booster amplifiers $22_1$ and $22_2$ in the present embodiment each have a structure similar to that of the booster amplifier 22 in the first embodiment. The booster amplifier $22_1$ amplifies the pulsed light of the first wavelength component outputted from (amplified by) the first amplifying unit of the pre-amplifier 21C, and outputs the amplified pulsed light via an optical head $31_1$. The booster amplifier $22_2$ amplifies the pulsed light of the second wavelength component outputted from (amplified by) the second amplifying unit of the pre-amplifier 21C, and outputs the amplified pulsed light via an optical head $31_2$.

The pulsed light source 3 in the present embodiment simultaneously uses both the pulsed light of the first wavelength component and the pulsed light of the second wavelength component, and for example, is preferably used in cases in which a starting point for optical damage is provided in a transparent strip material by irradiation with pulsed light with lower pulse energy, and then machining is promoted by irradiation with the other pulsed light with higher pulse energy.

In accordance with the present invention, optical power can be utilized effectively, and the pulse width of output pulsed light can be selected.

What is claimed is:
1. A pulsed light source, comprising:
a semiconductor laser being directly modulated and outputting pulsed light;
an optical filter branching the pulsed light outputted from the semiconductor laser into a first wavelength compo- nent including a peak wavelength of the pulsed light and a remaining second wavelength component; and an optical fiber amplifier selectively inputting one of the pulsed light of the first wavelength component and the pulsed light of the second wavelength component which are outputted from the optical filter, and amplifying the pulsed light inputted.

2. The pulsed light source according to claim 1, wherein the optical filter includes a dielectric multilayer film.

3. The pulsed light source according to claim 1, wherein the optical filter includes a fiber Bragg grating.

4. The pulsed light source according to claim 1, wherein in a pulse waveform defined by a relationship between optical power and time, pulse full width at half-maximums of the pulsed light of the first wavelength component and of the pulsed light of the second wavelength component, outputted from the optical filter, are different by a factor of 10 or more.

5. A pulsed light source, comprising:

a semiconductor laser being directly modulated and outputting pulsed light;

an optical filter branching the pulsed light outputted from the semiconductor laser into a first wavelength component including a peak wavelength of the pulsed light and a remaining second wavelength component; and optical fiber amplifying means for amplifying the pulsed light of the first wavelength component and/or the pulsed light of the second wavelength component which are outputted from the optical filter, wherein in a pulse waveform defined by a relationship between optical power and time, pulse full width at half-maximums of the pulsed light of the first wavelength component and of the pulsed light of the second wavelength component, outputted from the optical filter, are different by a factor of 10 or more.

6. The pulsed light source according to claim 5, wherein the optical fiber amplifying means selectively inputs one of the pulsed light of the first wavelength component and the pulsed light of the second wavelength component, and amplifies the pulsed light inputted.

7. The pulsed light source according to claim 5, wherein the optical fiber amplifying means comprises a first amplifying unit which amplifies the pulsed light of the first wavelength component and a second amplifying unit which amplifies the pulsed light of the second wavelength component.

8. The pulsed light source according to claim 5, wherein the optical filter includes a dielectric multilayer film.

9. The pulsed light source according to claim 5, wherein the optical filter includes a fiber Bragg grating.

* * * * *